United States Patent
Chu et al.

(10) Patent No.: US 11,901,246 B2
(45) Date of Patent: Feb. 13, 2024

(54) DISPLAY PANEL AND MANUFACTURING METHOD THEREOF, METHOD FOR DETECTING HOLE ACCURACY AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhiwen Chu, Beijing (CN); Xiangdan Dong, Beijing (CN); Yulong Wei, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 17/262,771

(22) PCT Filed: Apr. 9, 2020

(86) PCT No.: PCT/CN2020/083917
§ 371 (c)(1),
(2) Date: Jan. 25, 2021

(87) PCT Pub. No.: WO2021/203351
PCT Pub. Date: Oct. 14, 2021

(65) Prior Publication Data
US 2023/0134605 A1    May 4, 2023

(51) Int. Cl.
*H01L 21/66* (2006.01)
*H10K 71/00* (2023.01)
*H10K 59/124* (2023.01)
*H10K 59/12* (2023.01)

(52) U.S. Cl.
CPC ........... *H01L 22/30* (2013.01); *H10K 59/124* (2023.02); *H10K 71/00* (2023.02); *H10K 59/1201* (2023.02)

(58) Field of Classification Search
None
See application file for complete search history.

(56) References Cited

U.S. PATENT DOCUMENTS

| 2020/0064968 A1 | 2/2020 | Kim et al. |
| 2021/0028249 A1 | 1/2021 | Ding et al. |
| 2021/0083023 A1 | 3/2021 | Zheng et al. |

FOREIGN PATENT DOCUMENTS

| CN | 110211972 A | 9/2019 |
| CN | 110262108 A | 9/2019 |
| CN | 110265583 A | 9/2019 |

(Continued)

*Primary Examiner* — Michael Lebentritt
(74) *Attorney, Agent, or Firm* — Lippes Mathias LLP

(57) ABSTRACT

Provided is a display panel, including a through hole, an isolation area, and a display area. The isolation area is around the through hole. The isolation area is between the through hole and the display area. The isolation area includes at least two graphic marks for detecting the hole accuracy of the through hole. The at least two graphic marks are spaced apart from each other around the through holes. Graphic marks are arranged in an isolation area of a display panel. The isolation area is between a through hole and a display area. That is, the graphic marks are around the through hole.

19 Claims, 12 Drawing Sheets

(56) References Cited

FOREIGN PATENT DOCUMENTS

| | | | |
|---|---|---|---|
| CN | 110828519 A | | 2/2020 |
| JP | H11267862 A | * | 10/1999 |
| JP | 2008041920 A | * | 2/2008 |
| WO | WO2020036275 A1 | | 2/2020 |

* cited by examiner

DISPLAY PANEL AND MANUFACTURING METHOD THEREOF, METHOD FOR DETECTING HOLE ACCURACY AND DISPLAY DEVICE

CROSS-REFERENCE TO RELATED APPLICATION

The present application is a 371 of PCT Application No. PCT/CN2020/083917, filed on Apr. 9, 2020, the content of which is incorporated herein by reference.

TECHNICAL FIELD

The present disclosure relates to the field of displays, and in particular relates to a display panel and a manufacturing method thereof, a method for detecting hole accuracy, and a display device.

BACKGROUND

In recent years, display devices have entered the era of full screens with the gradual popularity of display devices with narrow bezels especially in the mobile industry. And the display device, such as a mobile phone or a tablet computer, generally requires to be provided with a camera, a sensor or other devices. In order to achieve a full screen, a through hole may be set in a position of the display panel corresponding to the camera, sensor and other devices, so as to facilitate the arrangement of these devices.

SUMMARY

Embodiments of the present disclosure provide a display panel and a manufacturing method thereof, a method for detecting hole accuracy, and a display device, which can detect the hole accuracy of the display panel more accurately. The technical solutions are as follows.

In one aspect, a display panel is provided. The display panel includes a through hole, an isolation area and a display area, wherein the isolation area is around the through hole, the isolation area is between the through hole and the display area, the isolation area includes at least two graphic marks for detecting hole accuracy of the through hole, and the at least two graphic marks are spaced apart from each other around the through hole.

In some embodiments, the display panel further includes a base substrate, a water-oxygen barrier layer and a thin-film transistor array layer which are sequentially stacked;

wherein the graphic mark is in the thin-film transistor array layer in the isolation area.

In some embodiments, the thin-film transistor array layer includes an active layer, a gate insulating layer, a gate layer, an insulating layer and a source-drain electrode layer which are sequentially stacked on the water-oxygen barrier layer; and the graphic mark is in the active layer or the gate layer.

In some embodiments, the graphic mark is a "T" shape or an "X" shape.

In some embodiments, when the shape of the graphic mark is the "T" shape, the "T" shape is provided with a first connecting portion and a second connecting portion, the first connecting portion is perpendicular to the second connecting portion, the first connecting portion is connected to a middle part of the second connecting portion, the second connecting portion is between the first connecting portion and the through hole, and straight lines where the first connecting portions of the at least two graphic marks are positioned intersect at one point.

In some embodiments, a number of the graphic marks ranges from two to six, and the graphic marks are evenly spaced apart from each other in the isolation area.

In some embodiments, the number of graphic marks is four, the four graphic marks are arranged into two pairs, and a connecting line of one pair of graphic marks and a connecting line of the other pair of graphic marks bisect with each other perpendicularly.

In some embodiments, the four graphic marks are distributed in a circular array around a center point.

In some embodiments, the isolation area is provided with at least one circle of isolation columns, each circle of isolation columns is arranged around the through hole, and the graphic marks are between the through hole and one circle of isolation columns proximate to the through hole.

In some embodiments, the at least one circle of isolation columns includes four circles of isolation columns, the four circles of isolation columns are spaced apart from each other, and circles wherein the four circles of isolation columns are positioned are concentric.

In some embodiments, the isolation area is provided with two circles of isolation columns, each circle of isolation columns is arranged around the through hole, and the graphic marks are between the two circles of isolation columns.

In some embodiments, isolation columns proximal to the through hole in the two circles of isolation columns include five circles of isolation sub-columns, the five circles of isolation sub-columns are spaced apart from each other, circles where the five circles of isolation sub-columns are positioned are concentric, a width of the isolation sub-column in a radial direction is less than a width of the isolation column in the radial direction, and a spacing between two adjacent circles of isolation sub-columns is less than a spacing of two adjacent circles of isolation columns.

In some embodiments, the isolation area is provided with at least one circle of spacers, the at least one circle of spacers is arranged around the through hole, and the at least one circle of spacers is between the two circles of isolation columns.

In some embodiments, the isolation area is provided with two circles of spacers, projections of the graphic marks on a first plane are at least partially overlapped with projections of the two circles of spacers on the first plane, and the first plane is a plane where a surface of the display panel is positioned.

In some embodiments, the gate layer of the display panel includes a gate line, a first signal line, a second signal line, and a first power signal line, and the source-drain electrode layer of the display panel includes a second power signal line and a data line; and in the isolation area, the gate line, the first signal line, the second signal line, the first power signal line, the second power signal line, and the data line are all around the through hole.

In some embodiments, the isolation area further includes a block-shaped spacer, a projection of the block-shaped spacer on a first plane are at least partially overlapped with a projection of the gate line of the isolation area on the first plane, and the first plane is a plane where a surface of the display panel is positioned.

In another aspect, a method for manufacturing a display panel is provided. The method includes:

manufacturing at least two graphic marks in an isolation area, wherein the at least two graphic marks are spaced apart from each other; and arranging a through hole in the display panel, wherein the isolation area is around the through hole, the isolation area is between the through hole and a display area, and the at least two graphic marks are configured to detect hole accuracy of the through hole.

In some embodiments, a number of the graphic marks is four, the four graphic marks are arranged into two pairs, and a connecting line of one pair of graphic marks and a connecting line of the other pair of graphic marks bisect with each other perpendicularly.

In still another aspect, a method for detecting hole accuracy of a display panel is provided. The method includes:

taking a picture of the display panel with an optical detector, wherein the display panel includes a through hole, an isolation area and a display area, the isolation area is around the through hole, the isolation area is between the through hole and the display area, the isolation area includes at least two graphic marks for detecting hole accuracy of the through hole, the at least two graphic marks are spaced apart from each other around the through hole, and the picture taken by the optical detector includes the graphic marks and the through hole;

determining minimum distances between an edge of the through hole and each of the graphic marks on the picture; and determining the hole accuracy according to the minimum distances between the edge of the through hole and each of the graphic marks.

In yet another aspect, a display device is provided in. The display device includes the display panel described in any one of the above aspects.

The technical solutions according to the embodiments of the present disclosure may at least achieve the following beneficial effects.

Graphic marks are arranged in an isolation area of a display panel and the isolation area is between a through hole and a display area. That is, the graphic marks are around the through hole. As the graphic marks have clear patterns, it is convenient for an optical detector to position the graphic marks and further determine distances between each graphic mark and an edge of the through hole when detecting hole accuracy. In this way, the distances detected between each graphic mark and the through hole are more accurate, which can improve the accuracy of the detected hole accuracy.

BRIEF DESCRIPTION OF DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and persons of ordinary skill in the art may also derive other drawings from these accompanying drawings without creative efforts.

DESCRIPTION OF EMBODIMENTS

In order to make the objects, technical solutions, and advantages of the present disclosure clearer, the embodiments of the present disclosure will be further described in detail hereinafter with reference to the accompanying drawings.

An organic light emitting display (OLED) usually includes an OLED component which is sensitive to water vapor and oxygen, so a water-oxygen barrier layer is required in the OLED component. However, for an OLED display panels with a through hole, water vapor and oxygen may readily enter the OLED component from the through hole when evaporating the OLED display panel, which thereof affects the performance and service life of the OLED component. Therefore, a plurality of circles of isolation columns is required to be arranged around the through hole. The isolation columns penetrate all the film layers above the water-oxygen barrier layer to block the intrusion channels of water vapor and oxygen.

After arranging a hole in the display panel, hole accuracy needs to be detected. If the hole accuracy is low, that is, the position of the through hole is deviated or the size of the through hole is wrong, the display panel must be discarded. In the related art, distances from an edge of the through hole to the isolation columns are detected by an optical detector to determine the hole accuracy.

However, the isolation columns in the display panel are arranged in a plurality of circles, and the distance between two adjacent circles of isolation columns is relatively short. When the optical detector detects the distances from the edge of the through hole to the isolation columns, it is difficult to identify the distance is from which circle of isolation columns to the edge of the through hole, and thus the determination result of the hole accuracy is inaccurate.

Figure 1:
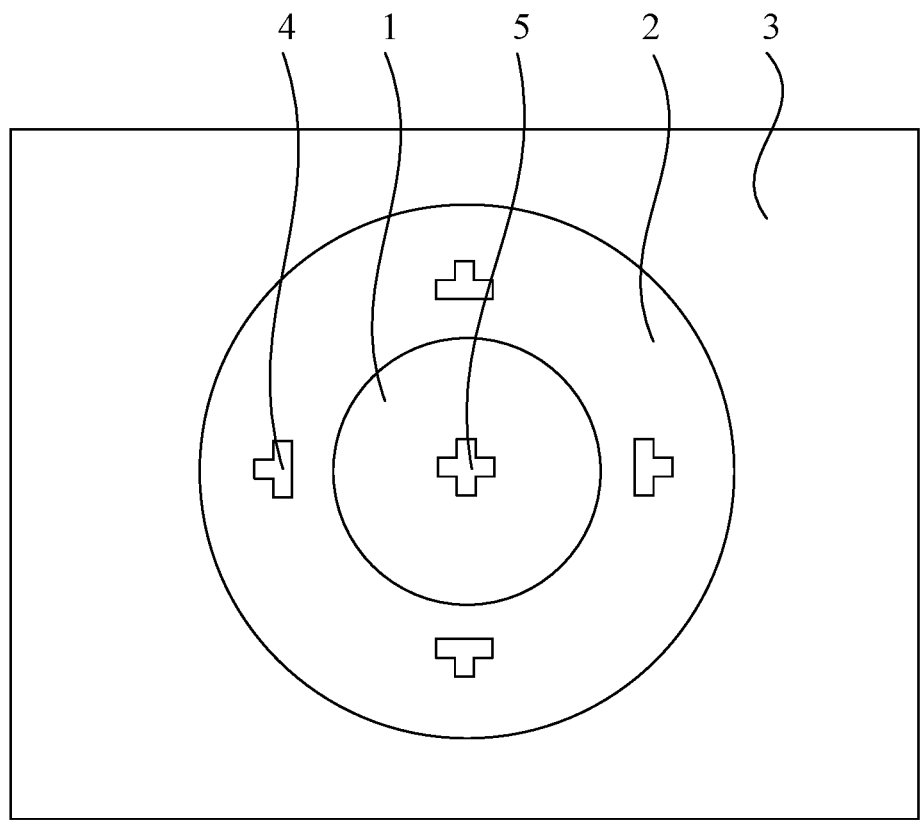
FIG. 1 is a schematic structural diagram of a part of a display panel according to an embodiment of the present disclosure.

FIG. 1 is a schematic structural diagram of a part of a display panel according to an embodiment of the present disclosure. Referring to FIG. 1, the display panel includes a through hole 1, an isolation area 2 and a display area 3. The isolation area 2 is around the through hole 1 and is between the through hole 1 and the display area 3. The isolation area 2 includes at least two graphic marks 4 for detecting hole accuracy of the through hole 1. The at least two graphic marks 4 are spaced apart from each other around the through hole 1.

In an exemplary embodiment, the graphic marks 4 are arranged in the isolation area 2 of the display panel, and the isolation area 2 is between the through hole 1 and the display area 3. That is, the graphic marks 4 are around the through hole 1. As the graphic marks 4 have clear patterns, it is convenient for an optical detector to position the graphic marks 4 and further determine the distances between each of the graphic marks 4 and the through hole 1 when detecting hole accuracy. In this way, the distances detected between the graphic marks 4 and the through hole 1 are more accurate, which can improve the accuracy of the detected hole accuracy.

In the embodiment of the present disclosure, the position of the through hole 1 may correspond to the position of such devices as a camera and a sensor and is used for arranging these devices to increase the screen-to-body ratio of the display panel, thereby realizing a full-screen design.

As shown in FIG. 1, the through hole 1 may be a circular through hole for arranging and installing devices such as cameras and sensors. In other implementations, the through hole 1 may also be set as other shapes according to the shape of the device. Only one through hole 1 is arranged in the display panel as shown in FIG. 1. In other implementations, two or more through holes 1 may be arranged. The specific number of through holes 1 may be set according to the number of devices to be arranged.

In the embodiment of the present disclosure, the display area 3 is configured for display. The display area 3 may also be referred to as an active area (AA).

In the embodiment of the present disclosure, the display area 3 may be provided with three types of pixel units, namely: red (R) pixel units, green (G) pixel units, blue (B) pixel units, referred to as RGB pixel units. In other implementations, the display area 3 may further be provided with white (W) pixel units to form RGBW pixel units.

In the embodiment of the present disclosure, the isolation area 2 is configured to isolate the through hole 1 and the display area 3, so as to avoid the light of the display area 3 leaking out from the through hole 1 and affecting the display effect of the display panel. At the same time, the isolation area may also play a role in water and oxygen-proofing by providing with isolation columns. As the isolation area 2 has no display effect, the graphic marks 4 will not affect the display effect of the display area 3 when being arranged in the isolation area 2.

As shown in FIG. 1, since the isolation area 2 is arranged between the through hole 1 and the display area 3, the isolation area 2 is generally an annular area in the case that through hole 1 is a circular through hole.

In the embodiment of the present disclosure, the optical detector may take a picture of the display panel when detecting the hole accuracy. The picture includes the graphic marks 4 and the through hole 1. The optical detector positions the graphic marks 4 and the through hole 1 in the picture. It is assumed that FIG. 1 is a picture taken. The optical detector may form an optical positioning mark 5 in the through hole 1, position the through hole 1 with the optical positioning mark 5, and determine a minimum distance between each graphic mark 4 and the through hole 1. The minimum distance is taken as the distance between the graphic mark 4 and the through hole 1. Then, difference values are determined by comparing each minimum distance with a set distance. If the difference value between the minimum distance and the set distance is within a range of ±A microns (μm), the display panel is qualified for use. If the difference value between the minimum distance and the set distances is not within the range of ±A micron, the hole accuracy of the display panel is low, which will affect the sensitivity of the device in the through hole 1, and the display panel is unqualified for being put into use.

In the embodiment of the present disclosure, ±A may be referred to as an error range. The value of A may be determined according to the size of the display panel and the size of the through hole 1, which is not limited in the present disclosure.

In the embodiment of the present disclosure, the graphic marks 4 may be a "T" shape or an "X" shape.

In an exemplary embodiment, as the "T"-shaped and "X"-shaped graphic marks 4 have clear boundary lines, it is convenient for the optical detector to position the graphic marks 4 and the through hole 1 in the picture and determine the distances between the graphic marks 4 and the through hole 1 after taking the picture of the display panel. In this way, the distances detected between the graphic marks 4 and the through hole 1 are more accurate, and detection of hole accuracy can be improved.

Figure 2:
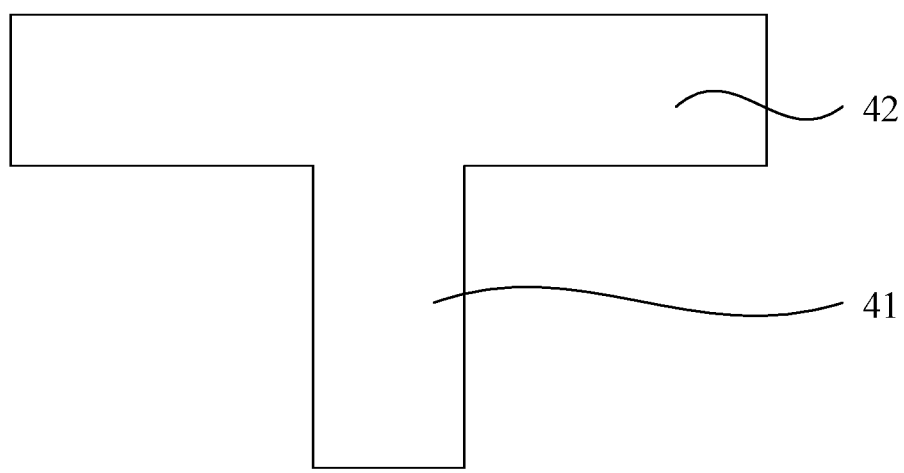
FIG. 2 is a top view of a "T"-shaped graphic mark according to an embodiment of the present disclosure.

In an exemplary embodiment, the graphic marks 4 are a "T" shape. FIG. 2 is a top view of a "T"-shaped graphic mark according to an embodiment of the present disclosure. Referring to FIG. 2, the "T" shape is provided with a first connecting portion 41 and a second connecting portion 42. The first connecting portion 41 and the second connecting portion 42 are perpendicular to each other. The first connecting portion 41 is connected to a middle part of the second connecting portion 42. Still referring to FIG. 1, the second connecting portion 42 is between the first connecting portion 41 and the through hole 1. Straight lines where the first connecting portion 41 of the at least two graphic marks 4 are positioned intersect at one point.

In an exemplary embodiment, the second connecting portion 42 is arranged between the first connecting portion 41 and the through hole 1. When the optical detector detects the hole accuracy, the position of the "T"-shaped graphic mark may be identified firstly, in this way, the position of the through hole 1 may be identified more quickly according to the arrangement of the positions of the first connecting portion 41 and the second connecting portion 42 in the "T"-shaped graphic mark. Then, the distance from the side to the through hole 1 can be detected, which ensures detection of the hole accuracy.

In order to facilitate the identification of the optical detector, the length of the second connecting portion 42 may be greater than the length of the first connecting portion 41, as shown in FIGS. 1 and 2.

In an exemplary embodiment, the number of graphic marks 4 ranges from two to six. The graphic marks 4 are evenly spaced apart from each other in the isolation area 2.

In an exemplary embodiment, two to six graphic marks 4 are evenly arranged around the through hole 1 at intervals. The distance between the edge of the through hole 1 and each graphic mark 4 can be detected by the optical detector. The hole accuracy of the display panel can be determined according to the distances from the plurality of graphic marks 4 to the through hole 1, which improves detection of the hole accuracy.

In an exemplary embodiment, the number of graphic marks 4 is four. The four graphic marks 4 are arranged into two pairs. A connecting line of one pair of graphic marks and a connecting line of the other pair of graphic marks bisect with each other perpendicularly.

Since the shapes of the four graphic marks are the same, the connecting line of one pair of graphic marks may be a connecting line of the same points of two graphic marks in the one pair of graphic marks.

In an exemplary embodiment, the number of graphic marks 4 is set to four, as such, it can not only ensure the above-mentioned effects, but also reduce the number of graphic marks. In this way, the calculation work of the optical detector is reduced when detecting the distances between the graphic marks 4 and the through hole 1, thereby improving the detection efficiency.

Further, the length of the connecting line of one pair of graphic marks may be equal to or different from the length of the connecting line of the other pair of graphic marks.

In the embodiment of the present disclosure, when a plurality of graphic marks 4 is arranged in the isolation area 2, the shapes of the plurality of graphic marks 4 may be the same or different, which is not limited in the present disclosure.

In the embodiment of the present disclosure, the four graphic marks 4 are distributed in a circular array around a center point. The circular array distribution of four graphic marks means that the four graphic marks are distributed circularly around the center point, each of the graphic marks have the same size and shape, and the positional relationships between the graphic marks 4 and the through hole 1 are the same. Thus, when any graphic mark 4 is rotated by a certain angle around the center, it can be completely overlapped with another graphic mark 4. In this way, it is convenient to determine the positions of the other graphic marks 4 when one of the graphic marks is determined during the detection.

In the embodiment of the present disclosure, when the through hole 1 is circular and the position of the through hole 1 is accurate, the center point is just the center of the circular through hole.

Figure 3:
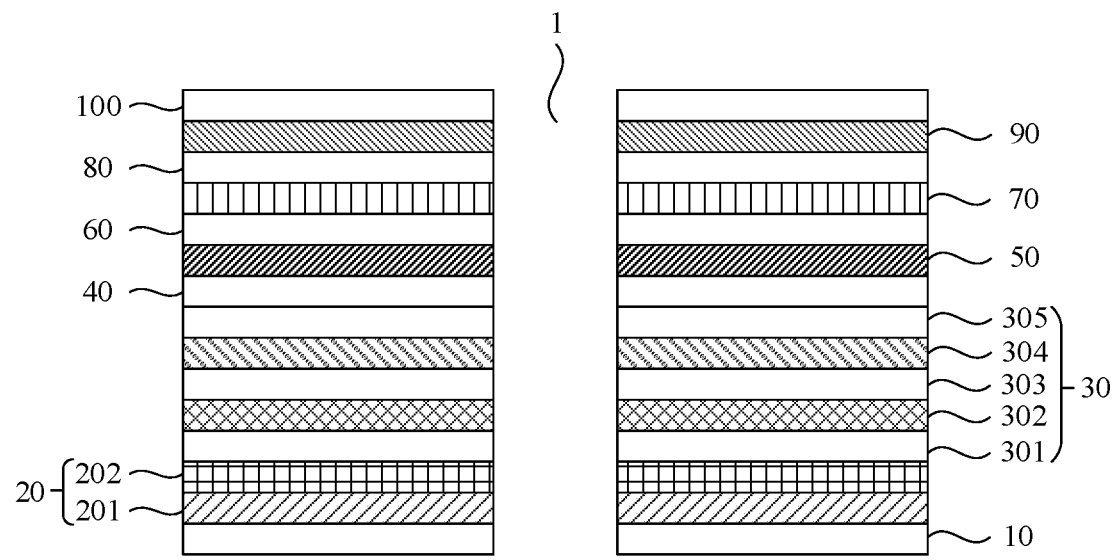
FIG. 3 is a schematic cross-sectional view of a display panel according to an embodiment of the present disclosure.

FIG. 3 is a schematic cross-sectional view of a display panel according to an embodiment of the present disclosure. Referring to FIG. 3, the display panel includes a base substrate 10, a water-oxygen barrier layer 20, and a thin-film transistor (TFT) array layer 30 that are sequentially stacked.

In an exemplary embodiment, the base substrate 10 may be a glass substrate. The glass substrate can ensure the strength of the base substrate 10. Further, as glass has good light transmittance, the patterns of the graphic marks 4 may be more clearly captured from the side of the base substrate 10 when the optical detector takes the picture of the display panel, which is convenient for the optical detector to position the graphic marks 4, so that the detected distances between the graphic marks 4 and the through hole 1 are more accurate, thereby improving detection of the hole accuracy.

In the embodiment of the present disclosure, the display panel may be an OLED display panel. The OLED display panel usually includes OLED component which is sensitive to water vapor and oxygen. When the OLED display panel is evaporated, the water-oxygen barrier layer 20 can prevent the water vapor and oxygen generated during evaporation easily entering the OLED component to affect the performance and service life of the OLED component.

Still referring to FIG. 3, the water-oxygen barrier layer 20 may include a first water and oxygen-proofing sub-layer 201 and a second water and oxygen-proofing sub-layer 202. The first water and oxygen-proofing sublayer 201 may be a polyimide (PI) layer. The second water and oxygen-proofing sublayer 202 may be an inorganic film layer, such as a silicon nitride layer, a silicon oxide layer, or an aluminum oxide layer.

In an exemplary embodiment, polyimide has good chemical stability, excellent mechanical properties and high insulation, and can block water vapor and oxygen to prevent water vapor and oxygen affecting the performance and service life of the OLED component. Similarly, the inorganic film layer may also protect the OLED component. In the present disclosure, the water-oxygen barrier layer 20 is provided as a lamination of a PI layer and an inorganic film layer, which can enhance the water and oxygen-proofing effect of the water-oxygen barrier layer 20.

In an exemplary embodiment, the water-oxygen barrier layer 20 may include a first water and oxygen-proofing sub-layer 201, a second water and oxygen-proofing sub-layer 202, and a lamination of the first water and oxygen-proofing sub-layer 201 and the second water and oxygen-proofing sub-layer 202.

In an exemplary embodiment, a plurality of the lamination of the first water and oxygen-proofing sub-layers 201 and second water and oxygen-proofing sub-layers 202 may be provided to improve the water and oxygen-proofing effect of the water-oxygen barrier layer.

In the embodiment of the present disclosure, the display panel includes a plurality of sub-pixel units. Each of the sub-pixel units includes at least two thin-film transistors, for example, seven thin-film transistors. The thin-film transistors are connected to an integrated circuit (IC). The thin-film transistors are controlled by the integrated circuit to drive the brightness of the organic light-emitting layer to make the display panel work. The thin-film transistors included in the plurality of sub-pixel units constitute the thin-film transistor array layer 30.

In an exemplary embodiment, the graphic marks 4 are in the thin-film transistor array layer 30 of the isolation area 2.

In an exemplary embodiment, the thin-film transistor array layer 30 is a film layer proximate to the base substrate 10 except for the water-oxygen barrier layer 20. Since the base substrate 10 is transparent, the closer the graphic marks 4 are to the base substrate 10, the clearer the images of the graphic marks 4 detected by the optical detector, and the easier it is to position the graphic marks 4. The graphic marks 4 are provided in a film layer proximal to the base substrate 10, so that the detected distances between the graphic marks 4 and the through hole 1 are more accurate, thereby improving detection of the hole accuracy.

In the embodiment of the present disclosure, the graphic marks 4 are provided in the thin-film transistor array layer 30 in the isolation area 2 instead of the water-oxygen barrier layer 20, preventing the graphic marks 4 from affecting the water and oxygen-proofing effect of the water-oxygen barrier layer 20.

Still referring to FIG. 3, the thin-film transistor array layer 30 includes an active layer 301, a gate insulating (GI) layer 302, a gate layer 303, an insulating layer 304, and a source-drain electrode (SD) layer 305 sequentially stacked on the water-oxygen barrier layer 20. The graphic marks 4 are in the active layer 301 or the gate layer 303 of the isolation area 2.

In the embodiment of the present disclosure, both the active layer 301 and the gate layer 303 are proximal to the base substrate 10. The graphic marks 4 are arranged in a film layer proximal to the base substrate 10, thus, the graphic marks 4 in the picture taken are clearer, and the detected distances between the graphic marks 4 and the through hole 1 are more accurate, thereby improving detection of the hole accuracy.

Figure 4:
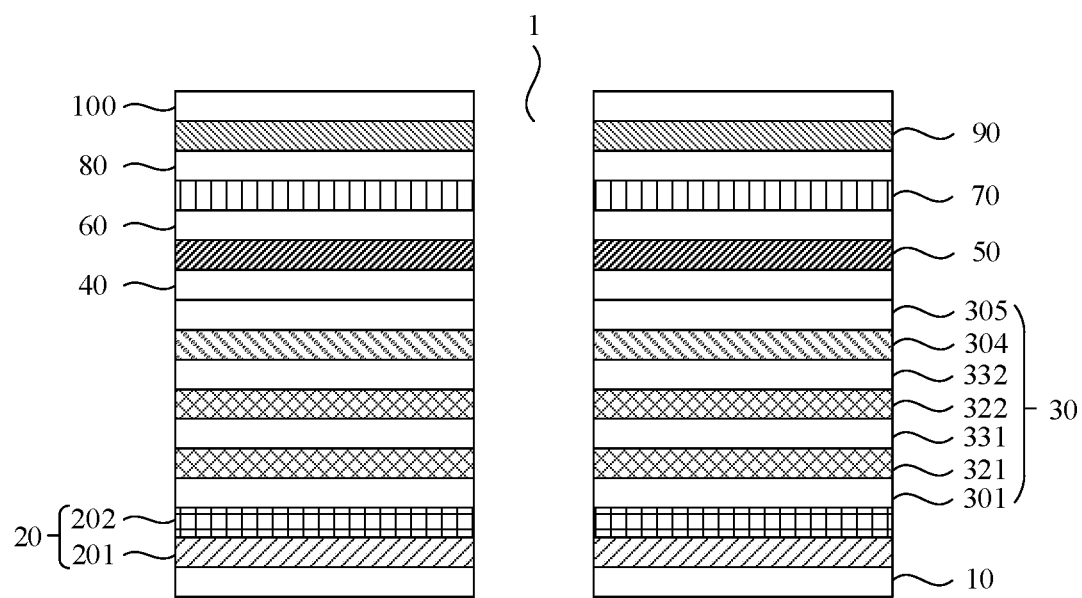
FIG. 4 is a schematic cross-sectional view of an OLED display panel according to an embodiment of the present disclosure.

FIG. 4 is a schematic cross-sectional view of an OLED display panel according to an embodiment of the present disclosure. The difference between the OLED display panels shown in FIG. 4 and FIG. 3 lies in the structure of the thin-film transistor array layer 30. Referring to FIG. 4, the thin-film transistor array layer 30 includes an active layer 301, a first gate insulating layer 321, a first gate layer 331, a second gate insulating layer 322, a second gate layer 332, an insulating layer 304, and a source-drain electrode layer 305 sequentially stacked on the water-oxygen barrier layer 20.

In the embodiment of the present disclosure, when two gate layers are provided in the OLED display panel, the graphic marks 4 may be in a film layer of the thin-film transistor array layer 30 proximal to the base substrate 10 except for the insulating layer, such as the active layer 301 or the first gate layer 331, which ensures that the graphic marks 4 are in a film layer proximal to the base substrate 10, thereby improving detection of the hole accuracy.

Referring to FIGS. 3 and 4, the OLED display panel further includes a first planarization (PLN) layer 40, an anode layer 50, a pixel definition layer (PDL) 60, an organic light-emitting layer 70 and a cathode layer 80 on the thin-film transistor array layer 30).

In the OLED display panel as shown in FIG. 4, the second gate insulating layer 322 is between the first gate layer 331 and the second gate layer 332. The second gate layer 332 is spaced apart from the first gate layer 331 by the second gate insulating layer 322, so as to ensure that the second gate layer 332 and the first gate layer 331 are spaced apart from each other to independently transmit signals. The insulating layer 304 is between the second gate layer 332 and the source-drain electrode layer 305 to ensure that the second gate layer 332 and the source-drain electrode layer 305 can independently transmit signals. The first planarization layer 40 is provided between the source-drain electrode layer 305 and the anode layer 50 to ensure that the source-drain electrode layer 305 can independently transmit signals.

In an example embodiment, the active layer 301 may be a low temperature poly-silicon (LTPS) layer. LTPS has high mobility and good stability, which can meet the requirements of high-resolution displays.

In an example embodiment, the first gate insulating layer 321, the second gate insulating layer 322, and the insulating layer 304 may be inorganic insulating layers, such as silicon nitride (chemical formula: SiN) insulating layers, or may be organic insulating layers, such as annular resin insulating layer. As the silicon nitride and annular resin have good insulation properties, the insulation properties of the first gate insulating layer 321, the second gate insulating layer 322 and the insulating layer 304 can be ensured.

In an example embodiment, the first planarization layer 40 can make the OLED display panel more planar, so as to facilitate arranging the anode layer 50. The first planarization layer 40 may be a resin layer. Resin has insulation properties, so that the insulation properties of the first planarization layer 40 can be ensured.

In an example embodiment, the second gate layer 332, the first gate layer 331, and the source-drain electrode layer 305 may be metal layers or indium tin oxide (chemical formula: ITO) layers, which can ensure the stability of the electrical signal transmission of the second gate layer 332, the first gate layer 331 and the source-drain electrode layer 305.

Exemplarily, the anode layer 50 may be a metal layer. The cathode layer 80 may be an indium tin oxide layer, which can ensure the conductivity of the anode layer 50 and the cathode layer 80.

In the embodiment of the present disclosure, the pixel definition layer 60 is configured to space apart the sub-pixel units of the organic light-emitting display. That is, the pixel definition layer 60 forms a plurality of sub-pixel areas in the display area 3 by its own groove structure.

In an example embodiment, the organic light-emitting layer 70 is provided with light-emitting units distributed in the grooves of the pixel definition layer 60. The organic light-emitting layer 70 may include a hole transport layer, a light-emitting layer, and an electron transport layer that are stacked.

Still referring to FIGS. 3 and 4, the display panel further includes a second planarization layer 90 and an encapsulation layer 100 sequentially stacked on the cathode layer 80.

In an example embodiment, the second planarization layer 90 is between the cathode layer 80 and the encapsulation layer 100. The second planarization layer 90 spaces apart the cathode layer 80 and the encapsulation layer 100, so as to prevent the encapsulation layer 100 from affecting the electrical signal transmission of the cathode layer 80. Meanwhile, the second planarization layer 90 may also make the OLED display panel more planar, so as to avoid the non-planarization of the OLED display panel affecting the display effect of the OLED display panel. The encapsulation layer 100 encapsulates the structure in the display panel to ensure the integrity of the display panel.

In an example embodiment, the second planarization layer 90 may be a resin layer. Resin has an insulation property, which ensures the insulation property of the second planarization layer 90.

In an example embodiment, the encapsulation layer 100 may be encapsulated in the form of thin-film encapsulation (TFE), so as to ensure the encapsulation effect.

Figure 5:
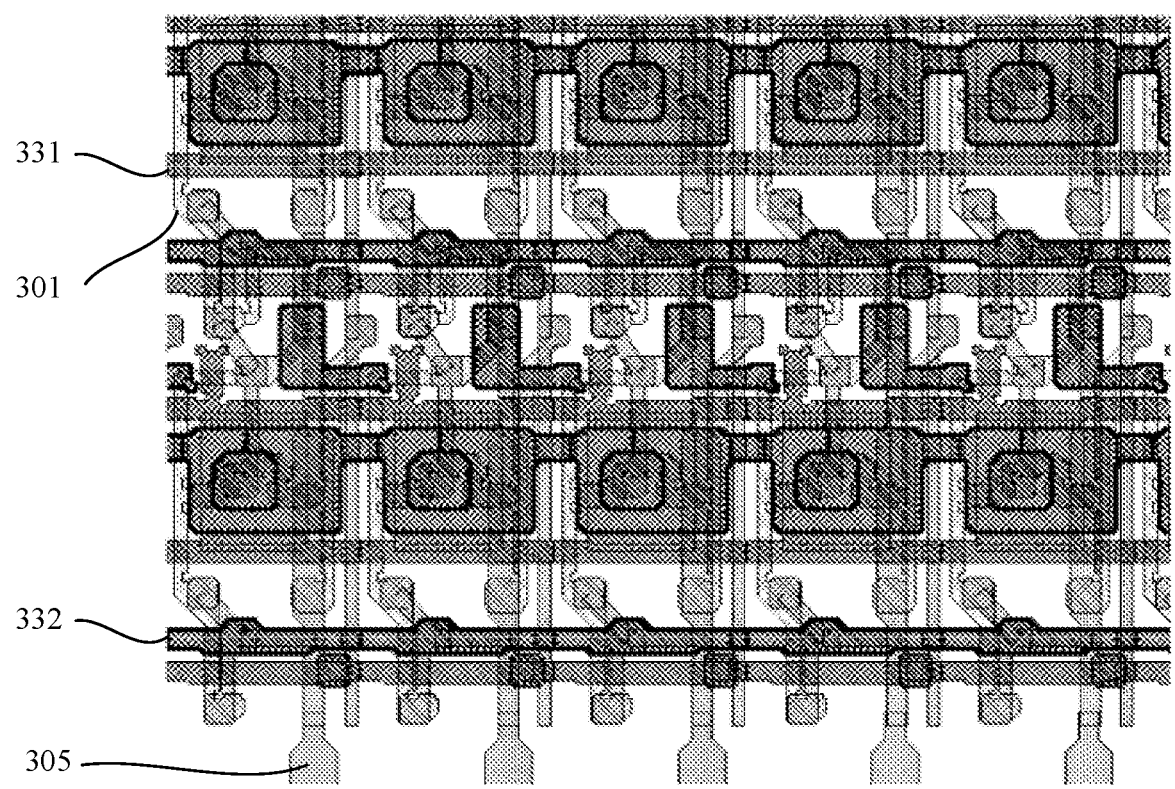
FIG. 5 is a schematic diagram of some film structures superimposed in a thin-film transistor array layer according to an embodiment of the present disclosure.

FIG. 5 is a schematic diagram of some film structures superimposed in the thin-film transistor array layer according to an embodiment of the present disclosure. Referring to FIG. 5, an active layer 301, a first gate layer 331, a second gate layer 332, and a source-drain electrode layer 305 are mainly included. The structures of the active layer 301, the first gate layer 331, the second gate layer 332, and the source-drain electrode layer 305 in FIG. 5 will be described as below in combination with FIGS. 6-9.

Figure 6:
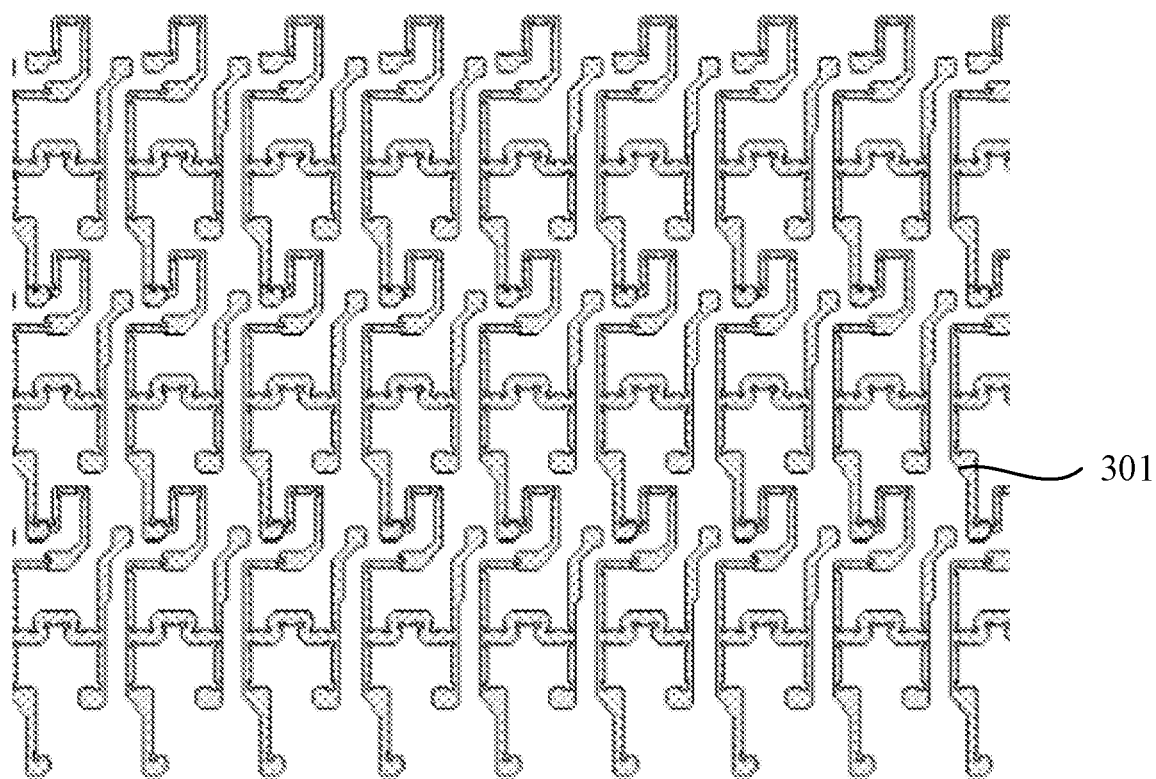
FIG. 6 is a schematic structural diagram of an active layer according to an embodiment of the present disclosure.

FIG. 6 is a schematic structural diagram of an active layer according to an embodiment of the present disclosure. Referring to FIG. 6, FIG. 6 shows the structure of the active layer in the display area. In the isolation area, the active layer may include the aforementioned graphic marks in addition to the graphic structure as shown in FIG. 6.

Figure 7:
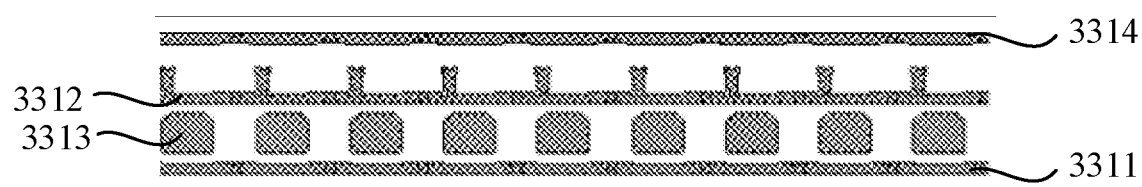
FIG. 7 is a schematic structural diagram of a first gate layer according to an embodiment of the present disclosure.

FIG. 7 is a schematic structural diagram of a first gate layer according to an embodiment of the present disclosure. Referring to FIG. 7, the first gate layer 331 may include a gate line 3311, a gate 3312, a first capacitor plate 3313, and a first signal line 3314. In the display area, only the gate line 3311 and the gate 3312 in the same row of pixels are connected.

In OLED display panels, a pixel circuit is generally a circuit with a plurality of thin-film transistors (T)+capacitors (C) such as 7T1C or 6T1C. In circuits such as 7T1C, in addition to providing GATE, VDD, DATA and other signals, voltage signals such as RESET, REF, Vint also need to be provided. The aforementioned first signal line 3314 can be configured to provide voltage signals.

FIG. 7 shows the structure of the first gate layer in the display area. In the isolation area, the first gate layer may include the aforementioned graphic marks 4 in addition to the graphic structure as shown in FIG. 7. Both the display area and the isolation area are formed in one patterning process. But compared to conventional processing, a mask used in the patterning process is provided with patterns corresponding to the aforementioned graphic marks 4 in the isolation area.

Figure 8:
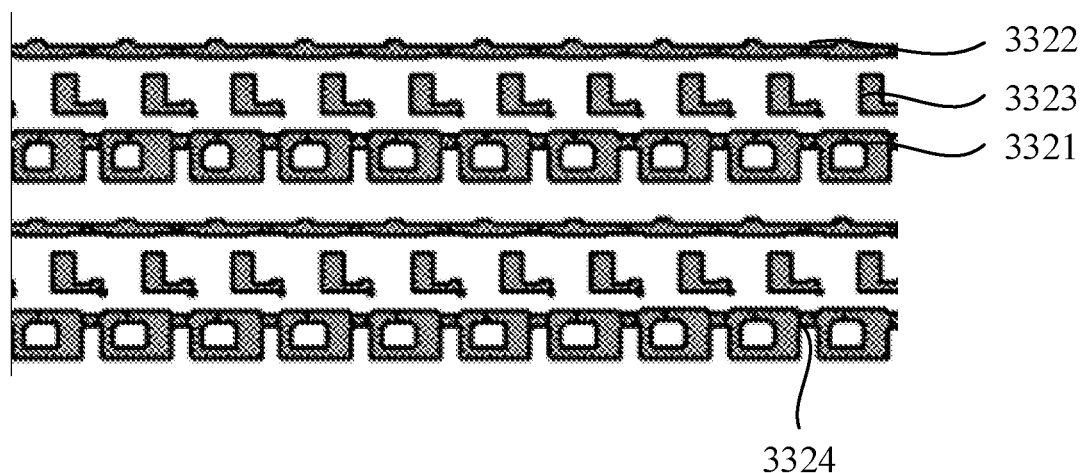
FIG. 8 is a schematic structural diagram of a second gate layer according to an embodiment of the present disclosure.

FIG. 8 is a schematic structural diagram of a second gate layer according to an embodiment of the present disclosure. Referring to FIG. 8, the second gate layer 332 includes a second capacitor plate 3321, a second signal line 3322, a third capacitor plate 3323, and a first power signal line 3324. The first capacitor plate 3313 and the second capacitor plate 3321 together form a storage capacitor (Cst). The storage capacitor may be a capacitor C in a circuit such as 7T1C. The third capacitor plate 3323 can form a capacitor with the active layer 301. The capacitor may be configured to stabilize a thin-film transistor in the 7T1C circuit. The second signal line 3322 may be configured to provide voltage signals such as RESET, REF, and Vint. The first power signal line 3324 may connect a row of second capacitor plates 3321 in series, so that these second capacitor plates 3321 also become part of the first power signal line 3324, thereby reducing the resistance of the first power signal line 3324.

Figure 9:
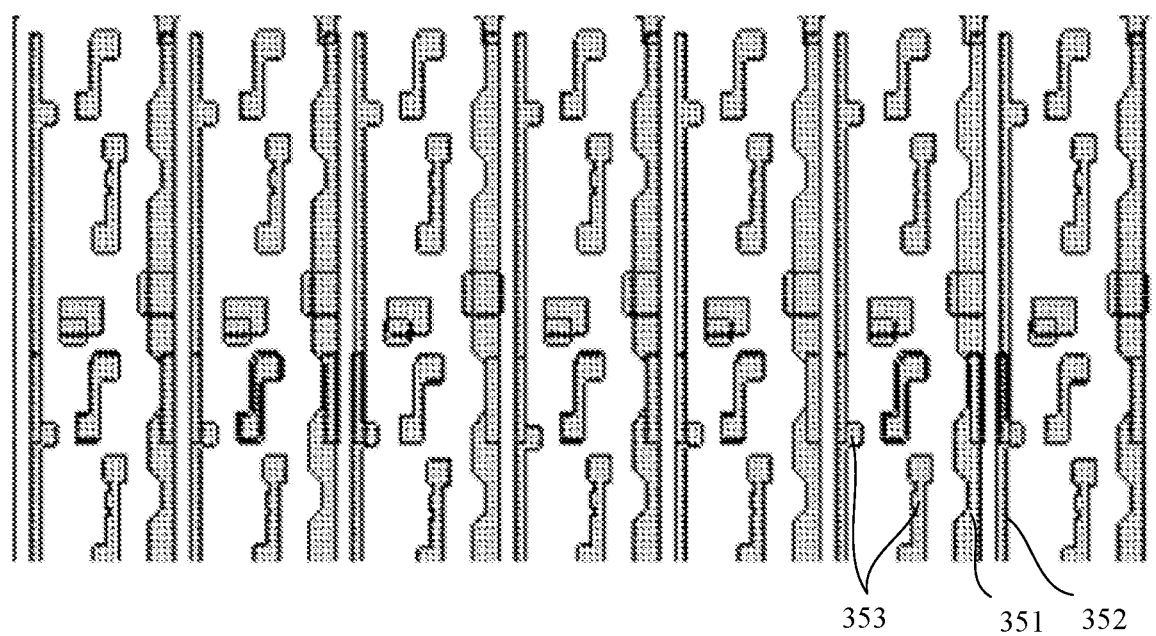
FIG. 9 is a schematic structural diagram of a source-drain electrode layer according to an embodiment of the present disclosure.

FIG. 9 is a schematic structural diagram of a source-drain electrode layer according to an embodiment of the present disclosure. Referring to FIG. 9, the SD layer 305 includes a second power signal line 351, a data line 352 and a source-drain electrode 353. The first power signal line 3324 and the second power signal line 351 are power signal lines arranged in cross, thereby forming a grid-like power signal line in the panel.

Figure 10:
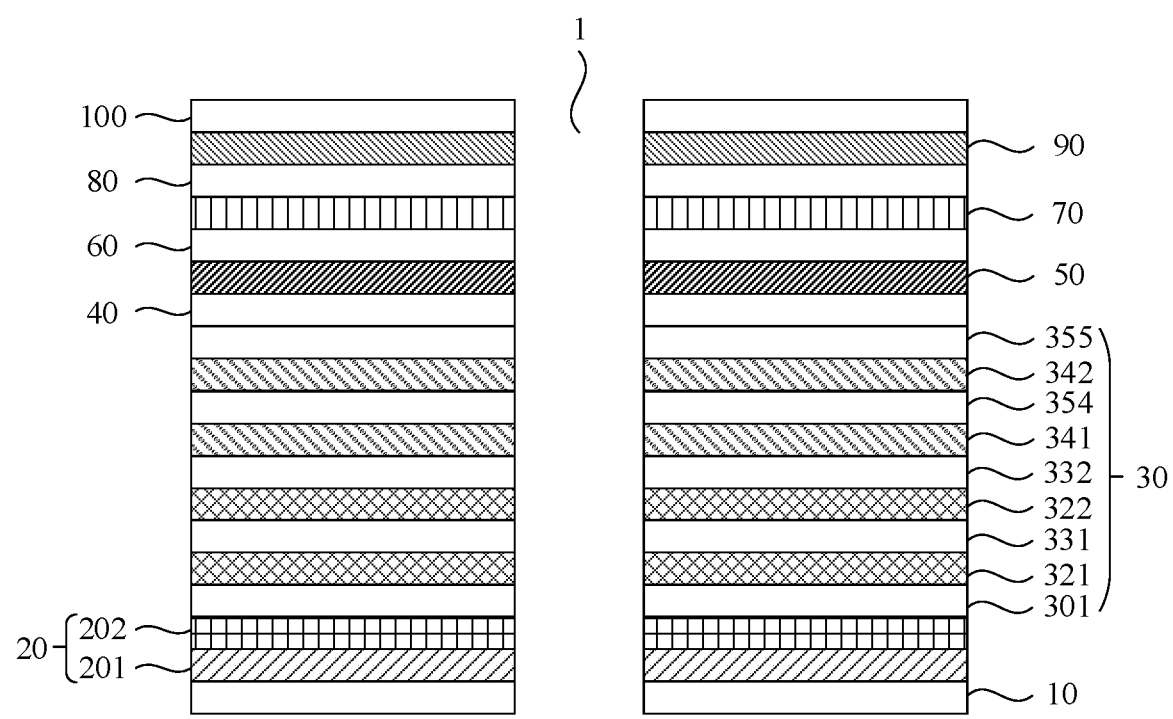
FIG. 10 is a schematic cross-sectional view of an OLED display panel according to an embodiment of the present disclosure.

FIG. 10 is a schematic cross-sectional view of an OLED display panel according to an embodiment of the present disclosure. The difference between the OLED display panels as shown in FIG. 10 and FIG. 4 lies in the structure of the thin-film transistor array layer 30. Referring to FIG. 10, the thin-film transistor array layer 30 includes an active layer 301, a first gate insulating layer 321, a first gate layer 331, a second gate insulating layer 322, a second gate layer 332, a first insulating layer 341, a first source-drain electrode layer 354, a second insulating layer 342, and a second source-drain electrode layer 355 that are sequentially stacked on the water-oxygen barrier layer 205.

In the structure shown in FIG. 10, the structures, which are originally arranged in one source-drain electrode layer, is distributed in two source-drain electrode layers. For example, the second power signal line 351 is arranged in the first source-drain electrode layer 354, and the data line 352 and the source-drain electrode 353 is arranged in the second source-drain electrode layer 355. As the second power signal line 351 and the source-drain electrode 353 as well as the data line 352 are arranged in layers, part of the data line 352 in the isolation area 2 may be jumped to and routed on the second source-drain electrode layer 355 to bypass the through hole 1, thereby reducing the area for routing around the through hole 1, that is, reducing the area of the isolation area 2 and increasing the area of the display area.

Figure 11:
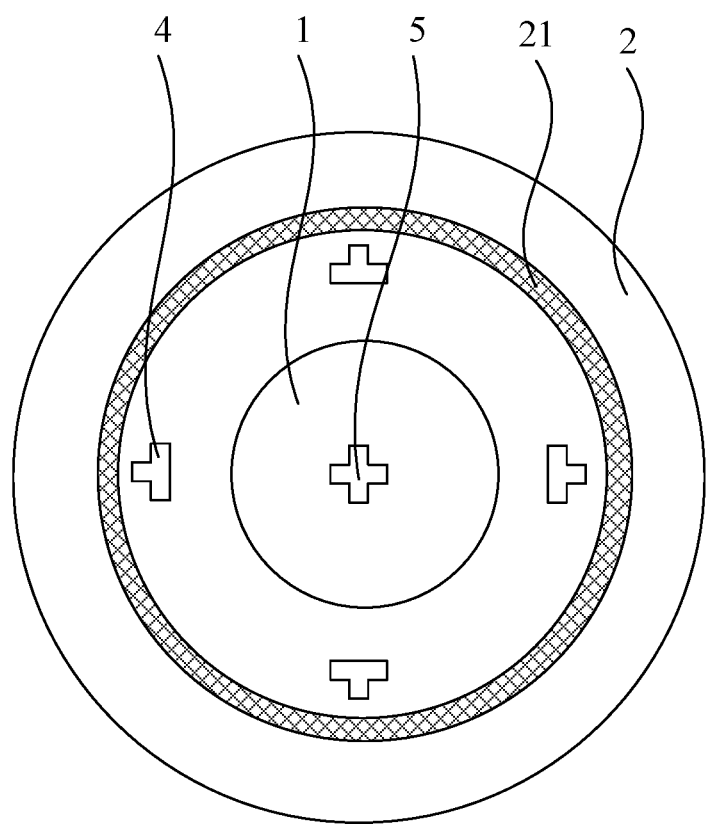
FIG. 11 is a schematic structural diagram of an isolation area of a display panel according to an embodiment of the present disclosure.

FIG. 11 is a schematic structural diagram of a part of an isolation area in a display panel according to an embodiment of the present disclosure. Referring to FIG. 11, the isolation area 2 is provided with at least one circle of isolation columns 21. Each circle of isolation columns 21 is arranged around the through hole 1. The graphic marks 4 are between the through hole 1 and a circle of isolation columns 21 which is proximate to the through hole 1. The isolation columns 21 may be disposed on the water-oxygen barrier layer 20 and penetrate all the film layers above the water-oxygen barrier layer 20.

In an example embodiment, for an OLED display panel with through holes, it is easy for luminescent materials, water vapor, and oxygen easily to enter the OLED component from the through holes when evaporating the OLED display panel, thereby affecting the performance and service life of the OLED component. Therefore, a plurality of circles of isolation columns 21 may be arranged around the through hole 1 and the isolation columns 21 penetrate all the film layers above the water-oxygen barrier layer 20, so as to block the intrusion channels of luminescent materials, water vapor and oxygen and avoid the luminescent materials, water vapor and oxygen affecting the performance and service life of the OLED component by entering the OLED component from the through hole 1.

In the embodiment of the present disclosure, the isolation columns 21 are arranged around the graphic marks 4. The graphic marks 4 are arranged between the isolation columns 21 and the through hole 1 to limit the position of the graphic marks 4, avoiding the graphic marks 4 being too distal away from the through hole 1 to affect the distances between the graphic marks 4 and the through hole 1 detected by the optical detector and thus affect detection of the hole accuracy.

In the embodiment of the present disclosure, the isolation columns 21 may be made of metal material. The metal has high strength, which can ensure the strength of the isolation columns, so as to avoid the isolation columns cracking to affect the function of the isolation columns, that is, avoid water vapor and oxygen entering the OLED component from the through hole 1 to affect the performance of the OLED component, thereby affecting the display effect.

Figure 12:
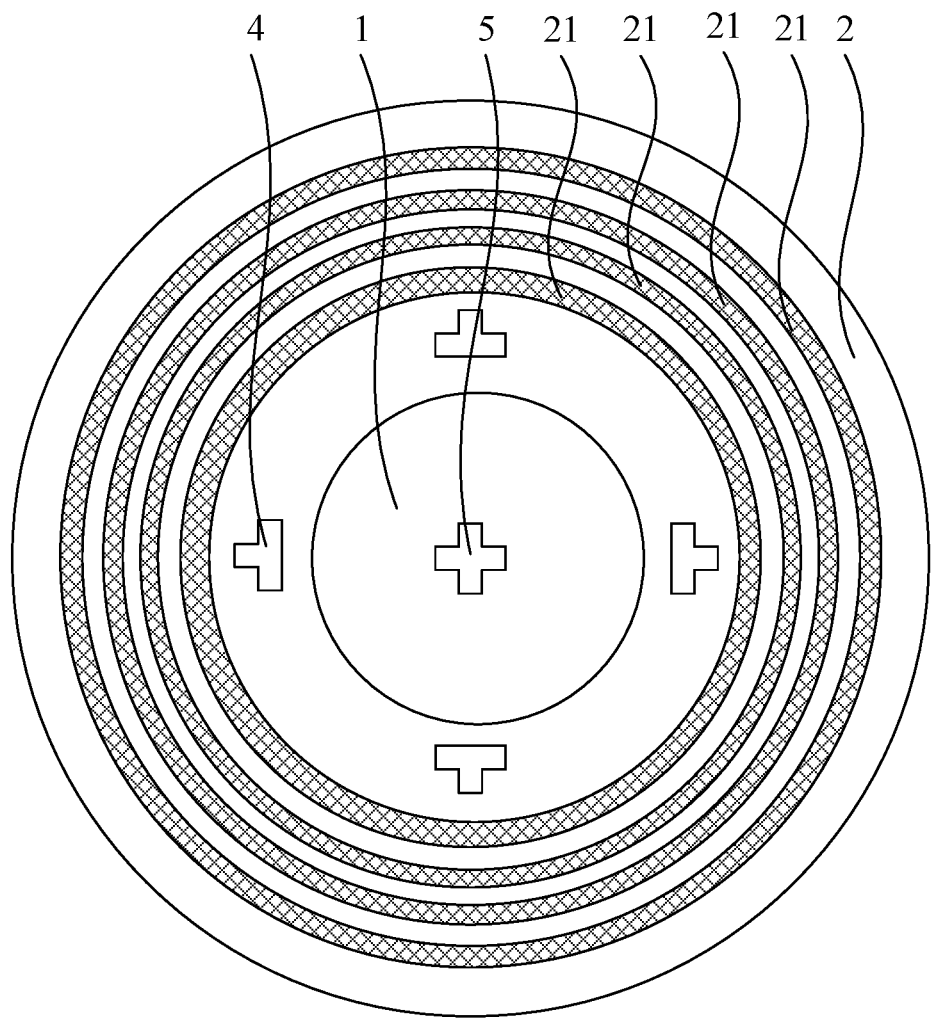
FIG. 12 is a schematic structural diagram of another isolation area of a display panel according to an embodiment of the present disclosure.

FIG. 12 is a schematic structural diagram of a part of another isolation area in a display panel according to an embodiment of the present disclosure. Referring to FIG. 12, the at least one circle of isolation columns 21 includes four circles of isolation columns. The four circles of isolation columns are spaced apart from each other. The centers of the circles where the four circles of isolation columns are coincide.

In an example embodiment, four circles of isolation columns are arranged to ensure the isolation effect of the isolation columns 21, so as to avoid affecting the performance and service life of the OLED component.

Figure 13:
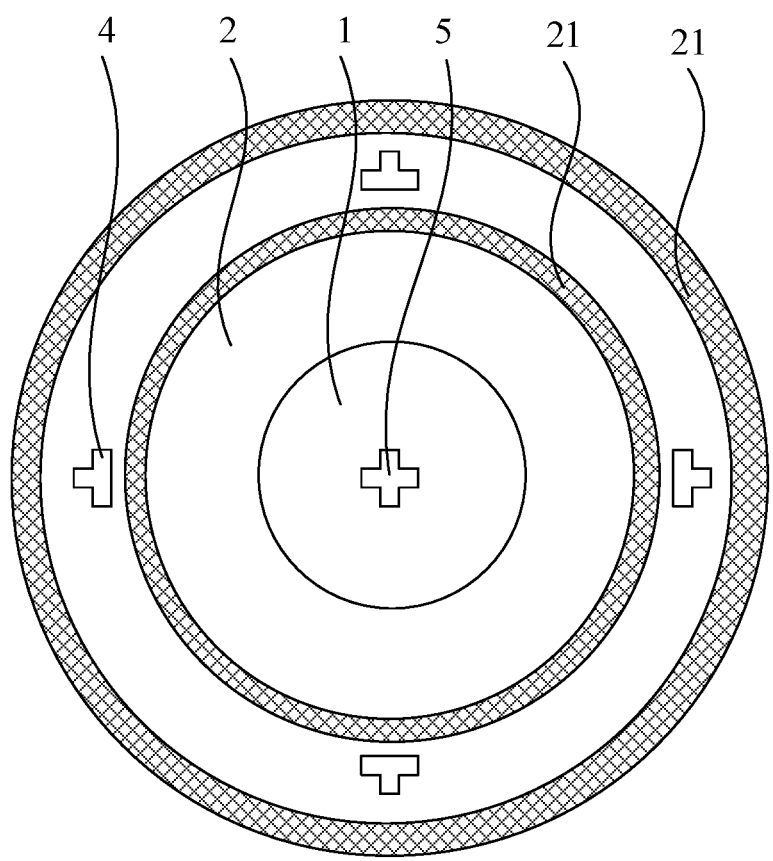
FIG. 13 is a schematic structural diagram of still another isolation area of a display panel according to an embodiment of the present disclosure.

FIG. 13 is a schematic structural diagram of a part of still another isolation area of a display panel according to an embodiment of the present disclosure. Referring to FIG. 13, the isolation area 2 is provided with two circles of isolation columns 21. Each circle of isolation columns 21 is arranged around the through hole 1. The graphic marks 4 are between the two circles of isolation columns 21.

In the related art, the distances from the edge of the through hole 1 to the isolation columns 21 are detected by the optical detector to determine the hole accuracy. In the present disclosure, the graphic marks 4 are placed between the two circles of isolation columns 21 to further limit the range of the graphic marks 4 so that the distances between the graphic marks 4 and the through hole 1 are equivalent to the distances between the through hole 1 and the isolation columns 21 originally detected. In this case, the changes to the detection process are small and no new detector is required, which is more convenient. Moreover, as the space between the two circles of isolation columns 21 is large, it is easy to arrange the graphic marks 4.

In the embodiment of the present disclosure, the center of the circle where the graphic marks 4 are coincides with the center of the circle where the isolation columns 21 are, which facilitates determining the positions of the graphic marks 4.

Figure 14:
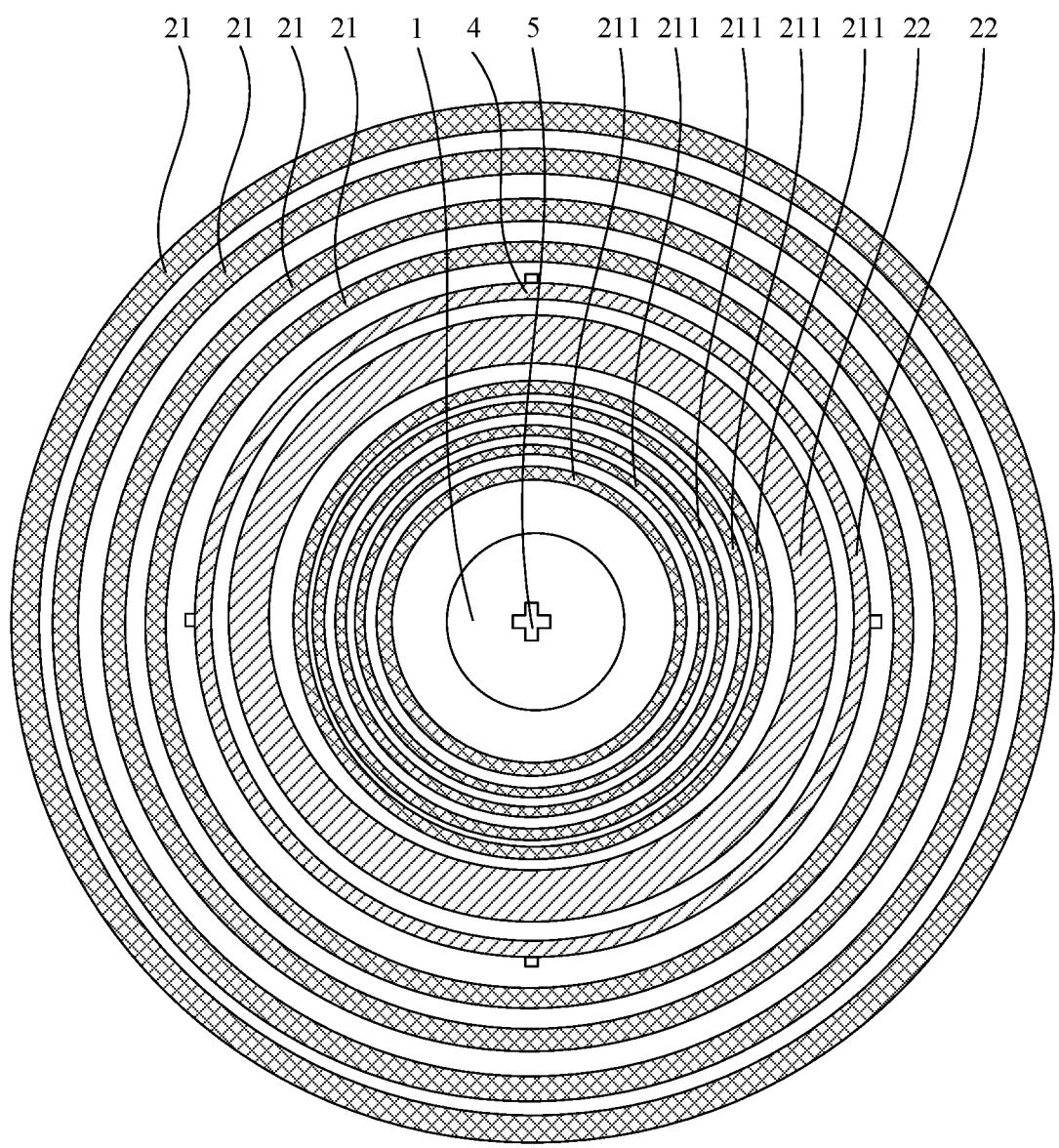
FIG. 14 is a schematic structural diagram of yet another isolation area of a display panel according to an embodiment of the present disclosure.

FIG. 14 is a schematic structural diagram of yet another isolation area of a display panel according to an embodiment of the present disclosure. Referring to FIG. 14, the isolation columns 21 of the two circles of isolation columns 21 proximal to the through hole 1 include five circles of isolation sub-columns 211. The five circles of isolation sub-columns 211 are spaced apart from each other. The circles where the five circles of isolation sub-columns 211 are positioned are concentric. A width of the isolation sub-column 211 in a radial direction is less than a width of the isolation column 21 in the radial direction. The spacing between two adjacent circles of isolation sub-columns 211 is less than the spacing between two adjacent circles of isolation columns 21.

In this implementation, the isolation columns proximal to the through hole 1 are arranged as five circles of isolation sub-columns 211. Since all these five circles of isolation sub-columns 211 have an isolation effect, the isolation effect of the isolation columns proximal to the through hole 1 can be enhanced, thereby prevent luminescent materials, water vapor and oxygen from easily entering the OLED component from the through hole 1.

Still referring to FIG. 14, the isolation area 2 is provided with at least one circle of spacers 22. The at least one circle of spacers 22 is arranged around the through hole. The at least one circle of spacers 22 is between two circles of isolation columns 21.

In an example embodiment, spacers 22 are provided in the isolation area 2. The spacers 22 play a supporting role on one hand, such as supporting the display substrate and the cover plate, and on the other hand, may be configured to control the cell gap of the display panel.

At the same time, the spacer 22 may also block an encapsulation material in the encapsulation layer, so as to avoid the encapsulation material overflowing from the through hole 1 when the encapsulation layer is manufactured.

As shown in FIG. 14, the isolation area 2 is provided with two circles of spacers 22. Projections of the graphic marks 4 on a first plane are at least partially overlapped with projections of the two circles of spacers 22 on the first plane. The first plane is the plane where the surface of the display panel lies.

In an exemplary embodiment, two circles of spacers 22 are arranged to ensure the isolation effect of the spacers 22. At the same time, the projections of the graphic marks 4 and the two circles of spacers 22 on the first plane at least partially overlap to ensure that the graphic marks 4 are between the two circles of spacers 21.

Figure 15:
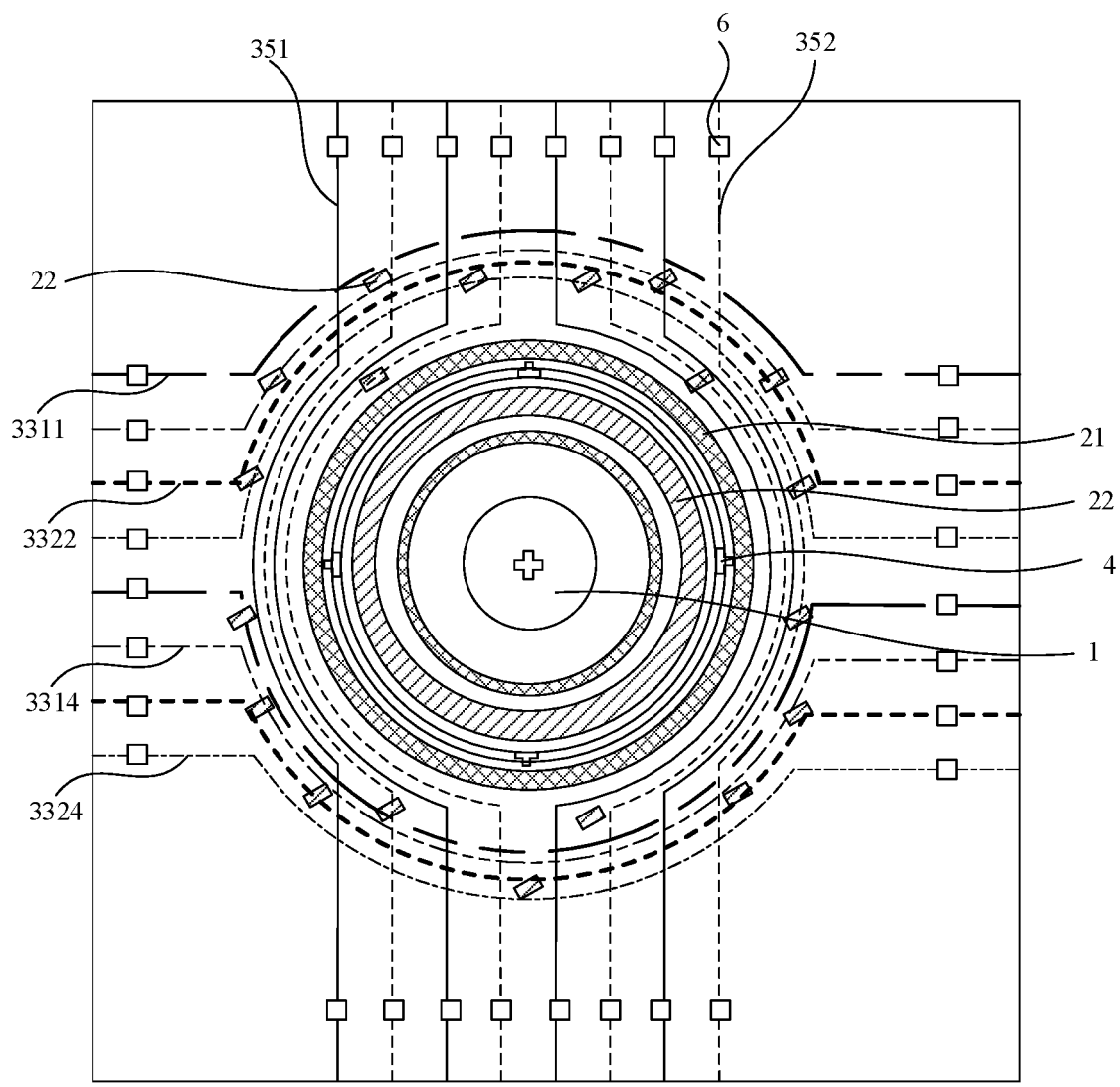
FIG. 15 is a schematic structural diagram of a part of a display panel according to an embodiment of the present disclosure.

FIG. 15 is a schematic structural diagram of a part of a display panel according to an embodiment of the present disclosure. Referring to FIG. 15, spacers 22 that are block-shaped may also be arranged in the isolation area. The spacers 22 may also be configured to support the encapsulation layer 100, so as to ensure the planarization of the display panel.

As shown in FIG. 15, projections of the spacers 22 that are block-shaped on the first plane are at least partially overlapped with projections of the gate lines in the isolation area on the first plane.

Still referring to FIG. 15, the display panel further includes a plurality of adapters 6. The adapters 6 are in the display area. The adapters 6 are proximal to the isolation area 2. The adapter 6 functions as a jumper, for example, jumping the data line of the first source-drain electrode layer from the first source-drain electrode layer to the second source-drain electrode layer.

As shown in FIG. 15, when the aforementioned gate line 3311 and data line 352 pass through the through hole 1, they may be routed around the through hole 1 to ensure that they will not be separated by the isolation area 2.

As shown in FIG. 15, the second power signal line 351 and the data line 352 that are in the vertical direction are in the source-drain electrode layer, and the gate line 3311, the first signal line 3314, the second signal line 3322 and the first power signal line 3324 that are in the horizontal direction are in the gate layer.

In the embodiment of the present disclosure, when two source-drain electrode layers are arranged, the second power signal line 351 and the data line 352 are respectively in different source-drain electrode layers. When the second power signal line 351 and the data line 352 are arranged around the isolation area, the area of the second power signal line 351 and the data line 352 that are bent around the isolation area can be reduced, thereby reducing the manufacturing difficulty. At the same time, as described above, part of the data line may also be jumped to and routed on the second source-drain electrode layer, further reducing the area for routing in the isolation area 2.

As shown in FIG. 15, the area between the through hole 1 and the outermost arc-shaped route arranged around the through hole 1 is the isolation area 2.

Figure 16:
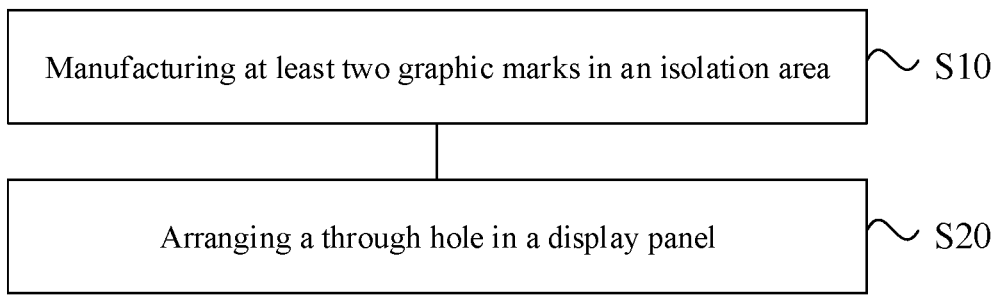
FIG. 16 is a flowchart showing a method for manufacturing a display panel according to an embodiment of the present disclosure.

An embodiment of the present disclosure also provides a method for manufacturing a display panel. FIG. 16 is a flowchart showing a method for manufacturing a display panel according to an embodiment of the present disclosure. Referring to FIG. 16, the method includes the following steps.

In step S10, at least two graphic marks are manufactured in an isolation area, the at least two graphic marks are spaced apart from each other.

In the embodiment of the present disclosure, the method for manufacturing a display panel includes the following steps.

In the first step, a base substrate is provided. The base substrate may be a glass substrate, so as to ensure the strength and light transmittance of the base substrate.

In the second step, a water-oxygen barrier layer is manufactured on the base substrate. The water-oxygen barrier layer may include a lamination formed by a polyimide layer and an inorganic film layer, so as to ensure the water and oxygen-proofing effect.

In the third step, a thin-film transistor array layer is formed on the water-oxygen barrier layer. Graphic marks may be arranged in the thin-film transistor array layer of the isolation area. The specific structure of the graphic mark may be made reference to the above description.

This step may include: sequentially forming an active layer, a gate insulating layer, a gate layer, an insulating layer, and a source-drain electrode layer on the water-oxygen barrier layer. For example, the graphic marks may be arranged in the active layer or the gate layer of the isolation area.

In the fourth step, a first planarization layer, an anode layer, a pixel definition layer, an organic light-emitting layer, a cathode layer, a second planarization layer, and an encapsulation layer are sequentially formed on the thin-film transistor array layer.

In step S20, a through hole is arranged in the display panel, the isolation area is around the through hole, and the isolation area is between the through hole and the display area. At least two graphic marks are configured to detect the hole accuracy of the through hole.

In an exemplary embodiment, the through hole may be arranged by laser drilling, to form the display panel as shown in FIG. 3.

In an exemplary embodiment, the number of graphic marks may be four. The four graphic marks are arranged into two pairs. A connecting line of one pair of graphic marks and a connecting line of the other pair of graphic marks bisect with each other perpendicularly. The hole accuracy of the display panel is determined by the distances between the four graphic marks and the through hole, which increases detection of the hole accuracy.

Figure 17:
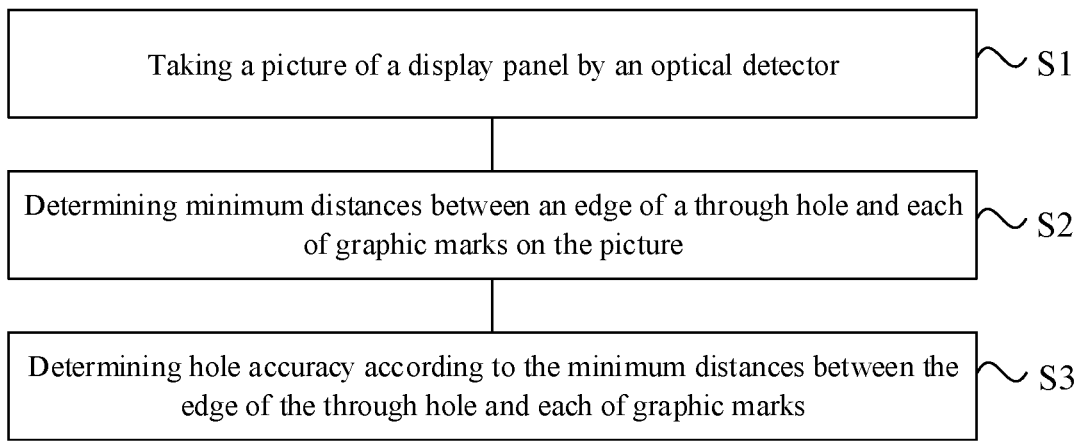
FIG. 17 is a flowchart showing a method for detecting hole accuracy of a display panel according to an embodiment of the present disclosure.

An embodiment of the present disclosure also provides a method for detecting hole accuracy of a display panel. FIG. 17 is a flowchart showing a method for detecting hole accuracy of a display panel according to an embodiment of the present disclosure. Referring to FIG. 17, the method includes the following steps.

In step S1, a picture of the display panel is taken by an optical detector. The display panel includes a through hole, an isolation area and a display area. The isolation area is between the through hole and the display area. The isolation area includes at least two graphic marks for detecting the hoe accuracy of the through hole. The at least two graphic marks are spaced apart from each other around the through hole. The picture taken by the optical detector includes the graphic marks and the through hole.

In an example embodiment, when detecting the hole accuracy, the optical detector may take the picture of the display panel from the side of the base substrate. The base substrate is transparent and does not shield the graphic marks and the through hole, which ensures the clarity of the picture.

In step S2, minimum distances between an edge of the through hole and each of graphic marks on the picture is determined.

In the embodiment of the present disclosure, the graphic marks and the through hole in the picture are positioned, then the minimum distance between the graphic marks and the edge of the through hole is determined. The minimum distance is taken as the distance between the graphic marks and the through hole.

In an example embodiment, when a plurality of graphic marks is arranged in the display panel, the minimum distance from each graphic mark to the edge of the through hole is determined.

In the embodiment of the present disclosure, for the process of identifying and positioning, the picture having the graphic mark may be used for training a model firstly, and then the trained model is adopted for identification, so as to ensure that the optical detector can accurately identify the position of the graphic mark.

In step S3, the hole accuracy is determined according to the minimum distances between the edge of the through hole and each of the graphic marks.

In the embodiment of the present disclosure, difference values are determined by comparing each of the above minimum distances with a set distance. If the difference value between the minimum distance and the set distance is within an error range, the hole accuracy meets the requirements, and the display panel is qualified for use. If the difference between the minimum distance and the set distance is not within the error range, the hole accuracy of the display panel is low, which will affect the sensitivity of the devices in the opening, and the display panel is unqualified for being put into use.

In an exemplary embodiment, difference values are determined by comparing each of the above minimum distances with a set distance. Only if all the difference values between each minimum distance and the set distance are within the error range, the hole accuracy meets the requirements, which improves detection accuracy.

Graphic marks are arranged around the through hole of the display panel. As the graphic marks have clear patterns, it is convenient for an optical detector to position the graphic marks when detecting accuracy. The optical detector can detect distances between each graphic mark and the through hole, so that the distance detected between the graphic mark and the through hole is more accurate, which improves the accuracy of the detected hole accuracy.

An embodiment of the present disclosure also provides a display device, which includes the display panel described in any one of the above.

In an example embodiment, the display device according to the embodiment of the present disclosure may be any product or component with a display function, such as a mobile phone, a tablet computer, a television, a monitor, a notebook computer, a digital photo frame, a navigator, and the like.

Described above are merely example embodiments of the present disclosure, and are not intended to limit the present disclosure. Any modifications, equivalent replacements, improvements, and the like made within the spirit and principle of the present disclosure shall be included in the scope of protection of the present disclosure.

What is claimed is:

1. A display panel, comprising a through hole, an isolation area and a display area, wherein the isolation area is around the through hole and is between the through hole and the display area, and wherein the isolation area comprises at least two graphic marks, and the at least two graphic marks are spaced apart from each other around the through hole,
   wherein the isolation area is provided with at least one circle of isolation columns, each circle of isolation columns is arranged around the through hole, and the graphic marks are between the through hole and one circle of isolation columns proximate to the through hole.

2. The display panel according to claim 1, comprising a base substrate, a water-oxygen barrier layer and a thin-film transistor array layer which are stacked;
   wherein the graphic mark is in the thin-film transistor array layer in the isolation area.

3. The display panel according to claim 2, wherein the thin-film transistor array layer comprises an active layer, a gate insulating layer, a gate layer, an insulating layer and a source-drain electrode layer which are sequentially stacked on the water-oxygen barrier layer;
wherein the graphic mark is in the active layer or the gate layer.

4. The display panel according to any one of claims 1 to 3, wherein the graphic mark is a "T" shape or an "X" shape.

5. The display panel according to claim 4, wherein the "T" shape is provided with a first connecting portion and a second connecting portion, wherein the first connecting portion is perpendicular to the second connecting portion, the first connecting portion is connected to a middle part of the second connecting portion, the second connecting portion is between the first connecting portion and the through hole, and straight lines where the first connecting portions of the at least two graphic marks are positioned intersect at one point.

6. The display panel according to claim 1, wherein a number of the graphic marks ranges from two to six, and the graphic marks are evenly spaced apart from each other in the isolation area.

7. The display panel according to claim 6, wherein the number of graphic marks is four, the four graphic marks are arranged into two pairs, and a connecting line of one pair of graphic marks and a connecting line of the other pair of graphic marks bisect with each other perpendicularly.

8. The display panel according to claim 7, wherein the four graphic marks are distributed in a circular array around a center point.

9. The display panel according to claim 1, wherein the at least one circle of isolation columns comprises four circles of isolation columns, the four circles of isolation columns are spaced apart from each other, and circles where the four circles of isolation columns are positioned are concentric.

10. The display panel according to claim 1, wherein the isolation area is provided with two circles of isolation columns, each circle of isolation columns is arranged around the through hole, and the graphic marks are between the two circles of isolation columns.

11. The display panel according to claim 10, wherein isolation columns proximal to the through hole in the two circles of isolation columns comprise five circles of isolation sub-columns, the five circles of isolation sub-columns are spaced apart from each other, circles where the five circles of isolation sub-columns are positioned are concentric, and wherein a width of the isolation sub-column in a radial direction is less than a width of the isolation column in the radial direction, and a spacing between two adjacent circles of isolation sub-columns is less than a spacing of two adjacent circles of isolation columns.

12. The display panel according to claim 10, wherein the isolation area is provided with at least one circle of spacers, the at least one circle of spacers is arranged around the through hole, and the at least one circle of spacers is between the two circles of isolation columns.

13. The display panel according to claim 12, wherein the isolation area is provided with two circles of spacers, wherein projections of the graphic marks on a first plane are at least partially overlapped with projections of the two circles of spacers on the first plane, and the first plane is a plane where a surface of the display panel is positioned.

14. The display panel according to claim 3, wherein the gate layer of the display panel comprises a gate line, a first signal line, a second signal line, and a first power signal line, and the source-drain electrode layer of the display panel comprises a second power signal line and a data line; and
wherein in the isolation area, the gate line, the first signal line, the second signal line, the first power signal line, the second power signal line and the data line are all around the through hole.

15. The display panel according to claim 14, wherein the isolation area further comprises a block-shaped spacer, wherein a projection of the block-shaped spacer on a first plane is at least partially overlapped with a projection of the gate line of the isolation area on the first plane, and the first plane is a plane where a surface of the display panel is positioned.

16. A method for manufacturing a display panel as defined in claim 1, comprising:
manufacturing at least two graphic marks in an isolation area, wherein the at least two graphic marks are spaced apart from each other; and
arranging a through hole in the display panel, wherein the isolation area is around the through hole and is between the through hole and a display area, and the at least two graphic marks are configured to detect accuracy of the through hole.

17. The method for manufacturing a display panel according to claim 16, wherein a number of the graphic marks is four, the four graphic marks are arranged into two pairs, and a connecting line of one pair of graphic marks and a connecting line of the other pair of graphic marks bisect with each other perpendicularly.

18. A method for detecting hole accuracy of a display panel, comprising:
taking a picture of the display panel with an optical detector, wherein the display panel comprises a through hole, an isolation area and a display area, the isolation area is around the through hole, the isolation area is between the through hole and the display area, the isolation area comprises at least two graphic marks for detecting hole accuracy of the through hole, the at least two graphic marks are spaced apart from each other around the through hole, and the picture taken by the optical detector comprises the graphic marks and the through hole;
determining minimum distances between an edge of the through hole and each of the graphic marks on the picture; and
determining the hole accuracy according to the minimum distances between the edge of the through hole and each of the graphic marks,
wherein the isolation area is provided with at least one circle of isolation columns, each circle of isolation columns is arranged around the through hole, and the graphic marks are between the through hole and one circle of isolation columns proximate to the through hole.

19. A display device, comprising a display panel, wherein the display panel comprises a through hole, an isolation area and a display area, wherein the isolation area is around the through hole and is between the through hole and the display area, and wherein the isolation area comprises at least two graphic marks for detecting accuracy of the through hole, and the at least two graphic marks are spaced apart from each other around the through hole,
wherein the isolation area is provided with at least one circle of isolation columns, each circle of isolation columns is arranged around the through hole, and the graphic marks are between the through hole and one circle of isolation columns proximate to the through hole.

* * * * *